(12) United States Patent
Jung et al.

(10) Patent No.: US 11,791,183 B2
(45) Date of Patent: Oct. 17, 2023

(54) METHOD AND APPARATUS FOR IC UNIT SINGULATION AND SORTING

(71) Applicant: Rokko Systems Pte Ltd, Singapore (SG)

(72) Inventors: Jong Jae Jung, Singapore (SG); Yun Suk Shin, Singapore (SG); Deok Chun Jang, Singapore (SG)

(73) Assignee: Rokko Systems Pte Ltd, Singapore (SG)

( * ) Notice: Subject to any disclaimer, the term of this patent is extended or adjusted under 35 U.S.C. 154(b) by 0 days.

(21) Appl. No.: 17/549,396

(22) Filed: Dec. 13, 2021

(65) Prior Publication Data

US 2022/0189805 A1 Jun. 16, 2022

(30) Foreign Application Priority Data

Dec. 15, 2020 (SG) .......................... 10202012571R

(51) Int. Cl.
| | |
|---|---|
| *H01L 21/06* | (2006.01) |
| *B65G 47/90* | (2006.01) |
| *H01L 21/67* | (2006.01) |
| *B07C 5/02* | (2006.01) |
| *B07C 5/34* | (2006.01) |

(52) U.S. Cl.
CPC .......... *H01L 21/67271* (2013.01); *B07C 5/02* (2013.01); *B07C 5/34* (2013.01); *B65G 47/90* (2013.01); *B65G 2203/00* (2013.01)

(58) Field of Classification Search
CPC ....... H01L 21/67271; B07C 5/02; B07C 5/34; B07C 5/361; B07C 5/362; B07C 5/38; B65G 47/90; B65G 2203/00

USPC ........................................................ 209/606
See application file for complete search history.

(56) References Cited

U.S. PATENT DOCUMENTS

| | | | | | |
|---|---|---|---|---|---|
| 7,829,383 | B2* | 11/2010 | Yang | ................. | H01L 21/67092 438/464 |
| 2002/0153277 | A1* | 10/2002 | Bjork | ..................... | B65D 85/38 206/701 |
| 2002/0194729 | A1* | 12/2002 | Kuribayashi | ...... | H05K 13/0815 29/832 |
| 2009/0237089 | A1* | 9/2009 | Cho | ................... | G01R 31/2893 324/555 |
| 2012/0260752 | A1* | 10/2012 | Yang | ................. | H05K 13/0409 74/665 A |
| 2015/0170944 | A1* | 6/2015 | Jung | ................. | H01L 21/67132 414/751.1 |
| 2020/0170119 | A1* | 5/2020 | Shin | ..................... | H05K 13/028 |

(Continued)

FOREIGN PATENT DOCUMENTS

| | | | | | |
|---|---|---|---|---|---|
| CN | 104377142 | A | * | 2/2015 | ....... H01L 21/67271 |
| CN | 110523646 | A | * | 12/2019 | |
| CN | 111940306 | A | * | 11/2020 | |

(Continued)

*Primary Examiner* — Gene O Crawford
*Assistant Examiner* — Muhammad Awais
(74) *Attorney, Agent, or Firm* — Dicke, Billig & Czaja, PLLC

(57) ABSTRACT

A unit sorting system comprising: a net table for receiving units and a unit lifter for depositing said units on the net table; the net table having a first and second zone; wherein the unit lifter is arranged to engage a batch of units and then deposit a first half of the batch to the first zone and deposit a first half of the batch to the second zone.

3 Claims, 13 Drawing Sheets

(56) References Cited

U.S. PATENT DOCUMENTS

2020/0353510 A1* 11/2020 Chandler ................. B07C 5/38

FOREIGN PATENT DOCUMENTS

| CN | 112060065 A | * | 12/2020 | |
|----|----|----|----|----|
| WO | WO-2007073356 A2 | * | 6/2007 | ........... B28D 5/0017 |
| WO | WO-2008054332 A2 | * | 5/2008 | ........... B28D 5/0094 |
| WO | WO-2016105277 A1 | * | 6/2016 | ....... H01L 21/67144 |
| WO | WO-2019032048 A1 | * | 2/2019 | ........... H05K 13/028 |
| WO | WO-2020213874 A1 | * | 10/2020 | ......... G01R 31/2862 |

* cited by examiner

METHOD AND APPARATUS FOR IC UNIT SINGULATION AND SORTING

CROSS-REFERENCE TO RELATED APPLICATIONS

This patent application claims priority to Singapore Application No. SG 10202012571R filed on Dec. 15, 2021, the disclosure of which is incorporated by reference herein in its entirety as part of the present application.

FIELD OF THE INVENTION

The invention relates to the processing of IC units including separation (singulation) from a substrate and subsequently sorting said IC units for offloading.

BACKGROUND

Maintaining UPH rates (units per hour) is a critical KPI for unit processing systems. Coupled with managing reject units before offloading, efficiently removing reject units without disrupting the UPH rate is an on-going problem.

So too, is the problem of ensuring the passing units do not become dislodged during packaging, particularly as rapid offloading may lead to eccentric loading of the units.

SUMMARY OF INVENTION

In a first aspect, the invention provides a unit sorting system comprising: a net table for receiving units and a unit lifter for depositing said units on the net table; the net table having a first and second zone; wherein the unit lifter is arranged to engage a batch of units and then deposit a first half of the batch to the first zone and deposit a first half of the batch to the second zone.

In a second aspect, the invention provides a unit sorting system comprising: a net table arranged to receive a batch of units; a unit picker assembly arranged to engage at least of said units; a control system for identifying rejected units; wherein said control system is arranged to control the unit picker to engage and remove at least one rejected unit from the batch.

In a third aspect, the invention provides an offloading system comprising: a channel having slots through which units are directed from a delivery chute to an offloading tray; said channel including a top guide positioned above said channel, said top guide having grooves corresponding said slots; wherein said slots align the units relative to a longitudinal axis of said channel.

In a fourth aspect, the invention provides an offloading system comprising: a channel having slots through which units are directed from a delivery chute to an offloading tray; said channel including a tray stopper and tray lifter for engaging the offloading tray; said tray stopper having projections, said projections arranged to engage rows of a tray; said tray lifter arranged to engage a base of the tray and apply a resilient force to the tray so as to hold the tray against the tray stopper.

In a fifth aspect, the invention provides a method for sorting units, the method comprising the steps of: engaging a batch of units using a unit lifter; depositing a first half of the batch on a first zone of the net table; depositing a second half of the batch on a second zone of the net table; such that the first and second batches are placed in a check board pattern

BRIEF DESCRIPTION OF DRAWINGS

It will be convenient to further describe the present invention with respect to the accompanying drawings that illustrate possible arrangements of the invention. Other arrangements of the invention are possible and consequently, the particularity of the accompanying drawings is not to be understood as superseding the generality of the preceding description of the invention

DETAILED DESCRIPTION

FIGS. 1 to 9 show several aspects of a sorting and offloading system for the distribution of units following upstream processes such as singulation, washing and/or inspection. The various aspects may be applicable to a range of unit handling systems. The various aspects according to the present invention is consequently not bound by the upstream processes, or for use with each other, other than for the distribution of units to a net table, and the delivery of units from the net table to an unloading zone.

Figure 1:
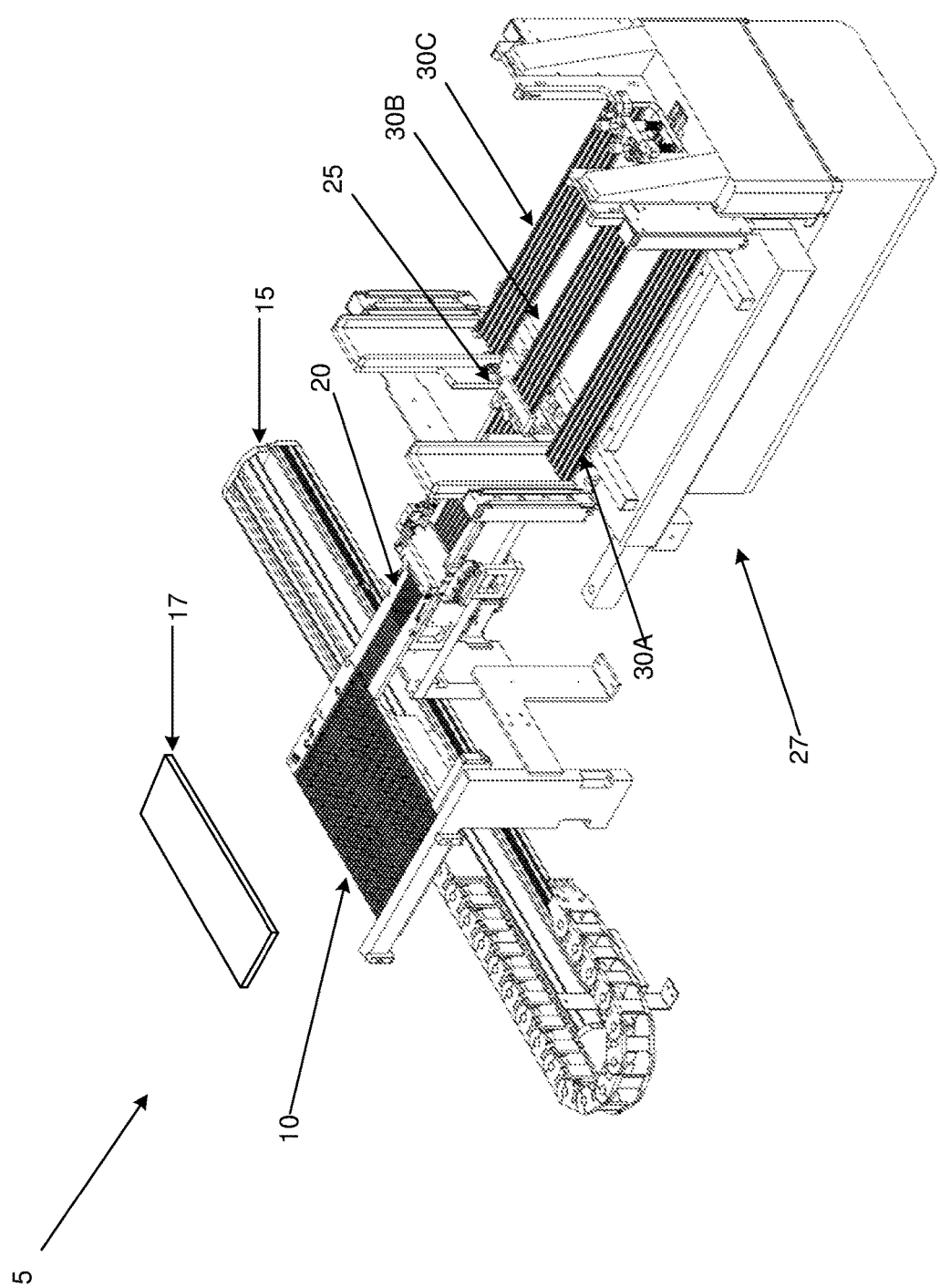
FIG. 1 is an isometric view of a sorting and offloading system according to one embodiment of the present invention.
Figure 2A:
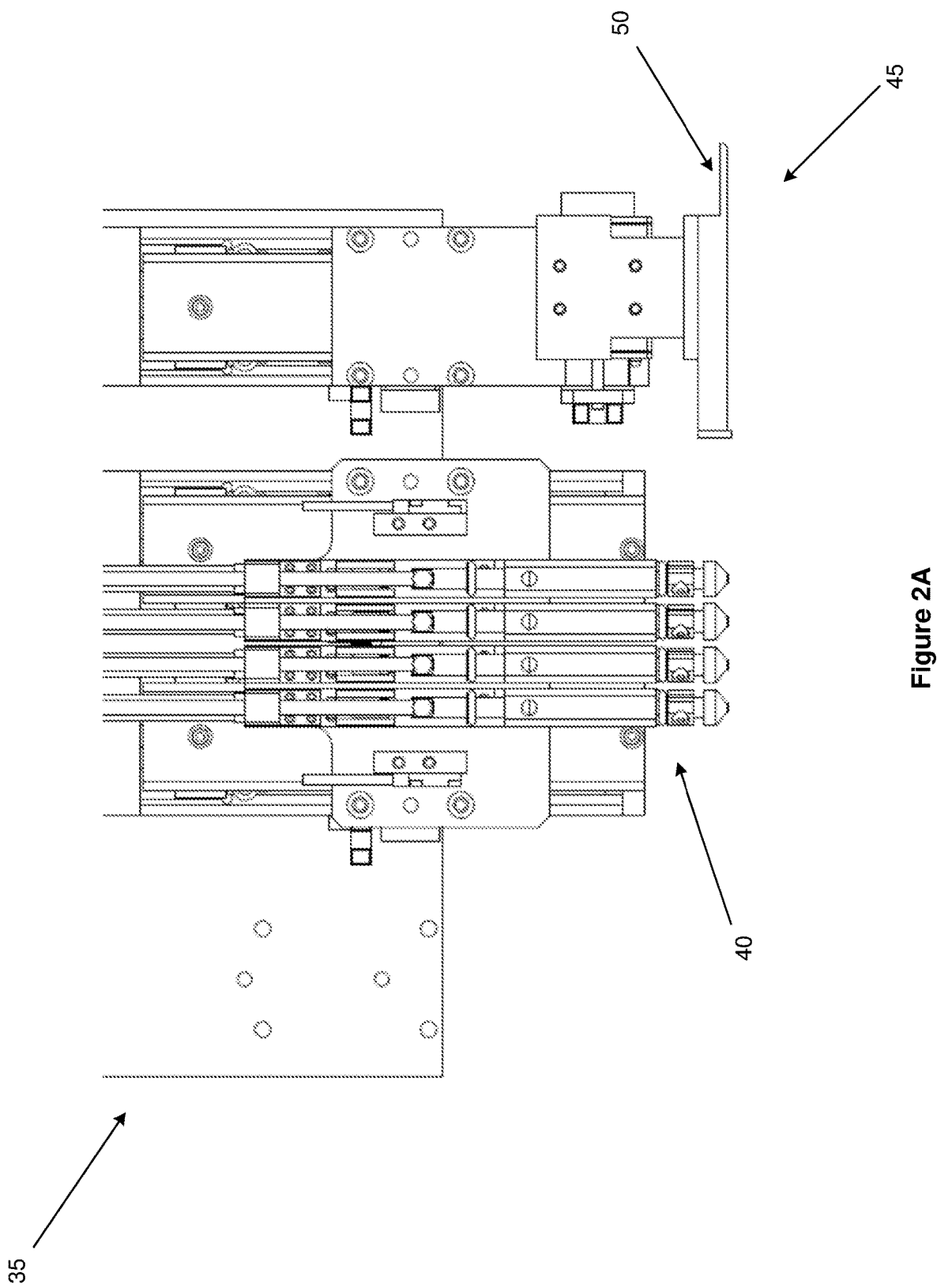
FIGS. 2A and 2B are various views view of a pick & place and gang pusher arrangement according to one embodiment of the present invention.
Figure 2B:
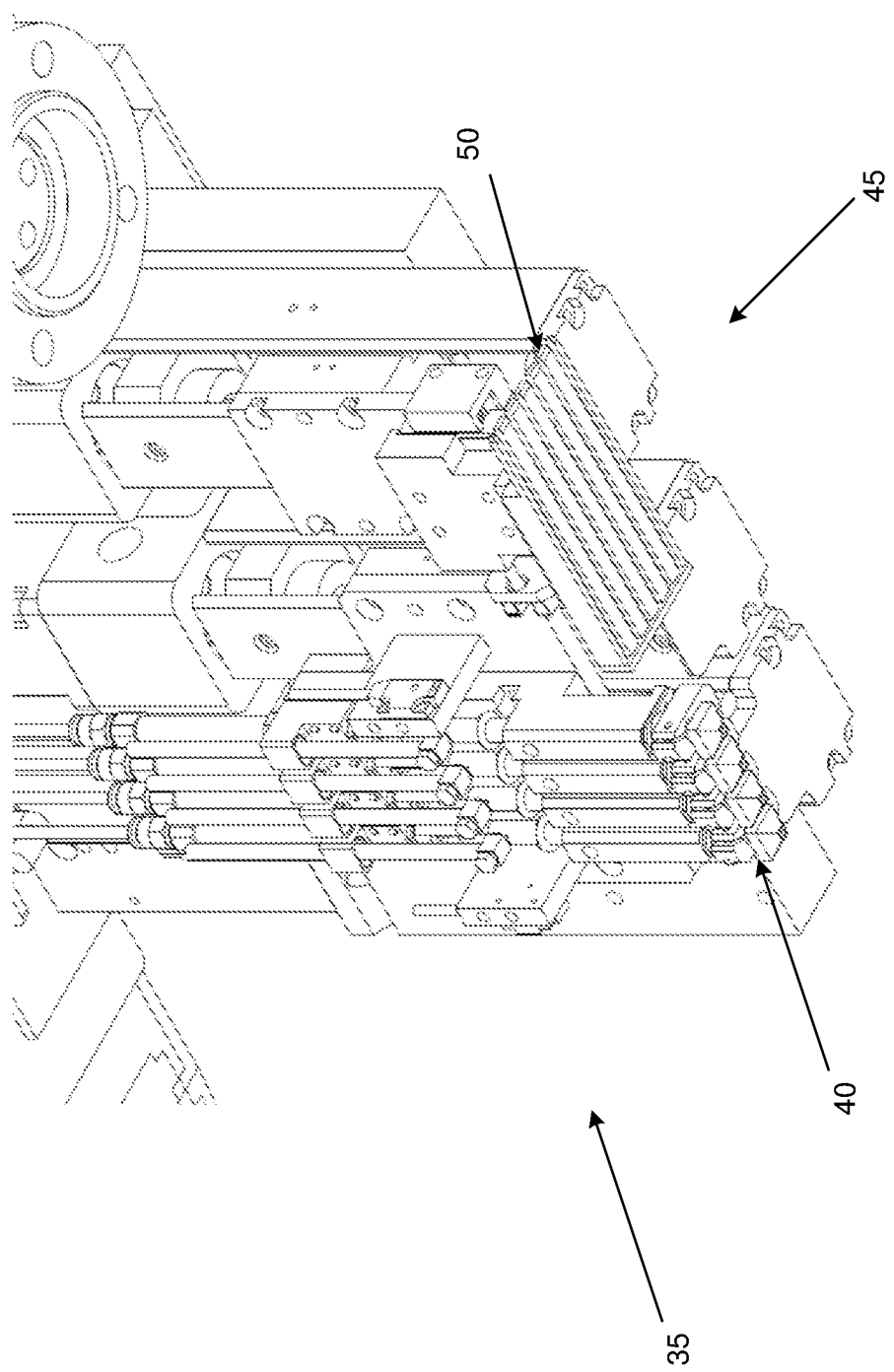

FIG. 1 shows several of the aforementioned aspects, as part of one embodiment of a sorting and offloading system 5 according to the present invention. The system 5 comprises a unit lifter 17 arranged to place units on a net table 10. A gang pusher (not shown) then pushes units onto a delivery chute 20 and through a unit stopper 25 to subsequently be loaded onto trays at an offloading station 27. The trays may be of any suitable material including metal (steel, aluminum) or plastic (ABS, PP etc.). The system further includes a unit picker, which are shown with the gang pusher in FIGS. 2A and 2B.

In one aspect, prior to being loaded to the sorting zone 20, the delivery of the units to the net table by the unit lifter 17, and subsequent sorting, will be explained with reference to FIGS. 2A, 2B, 3, 4, 5A to 5C.

Figure 5A:
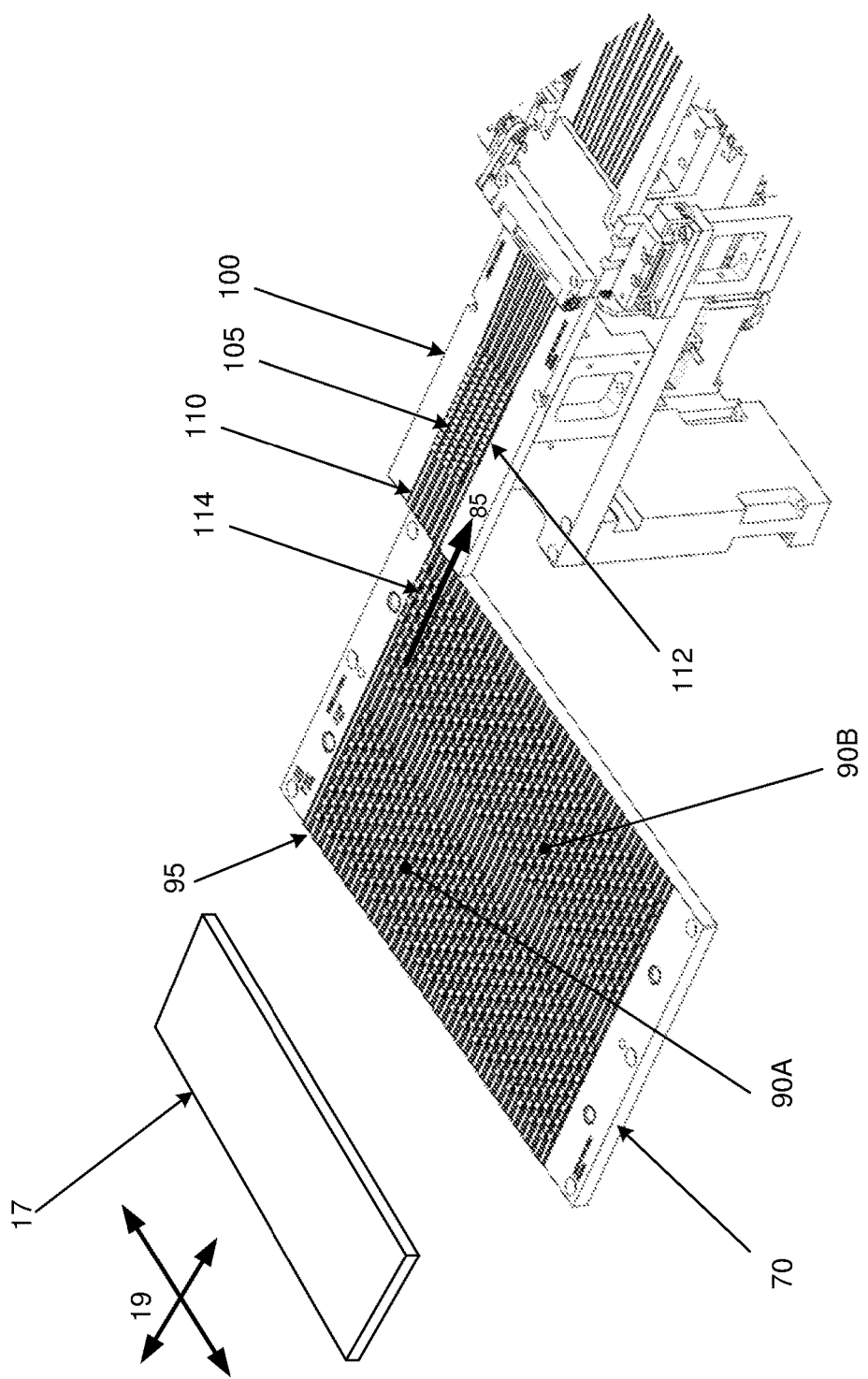
FIG. 5A to 5C are isometric views of a net table sorting arrangement according to one embodiment of the present invention.
Figure 5B:
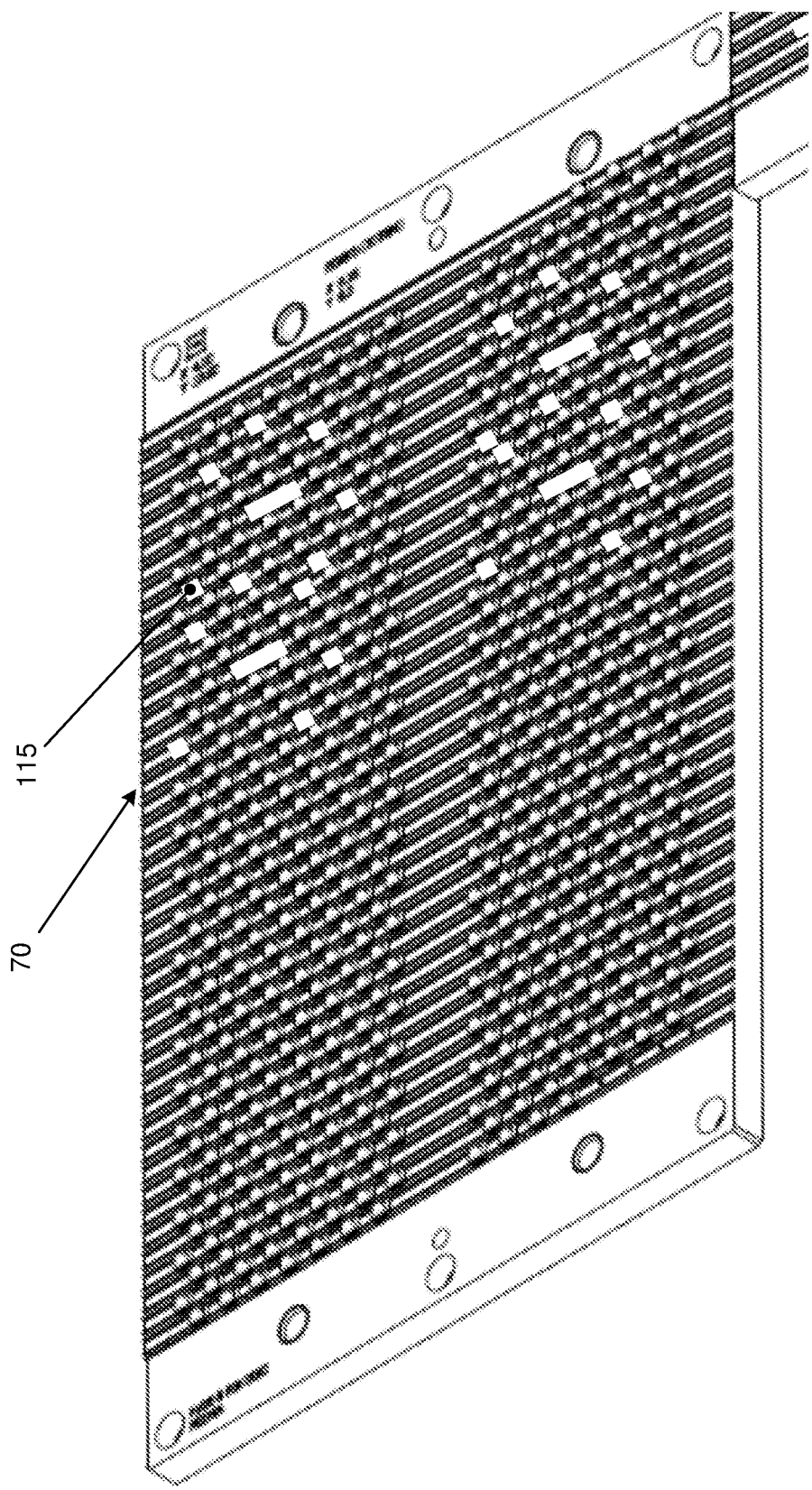
Figure 5C:
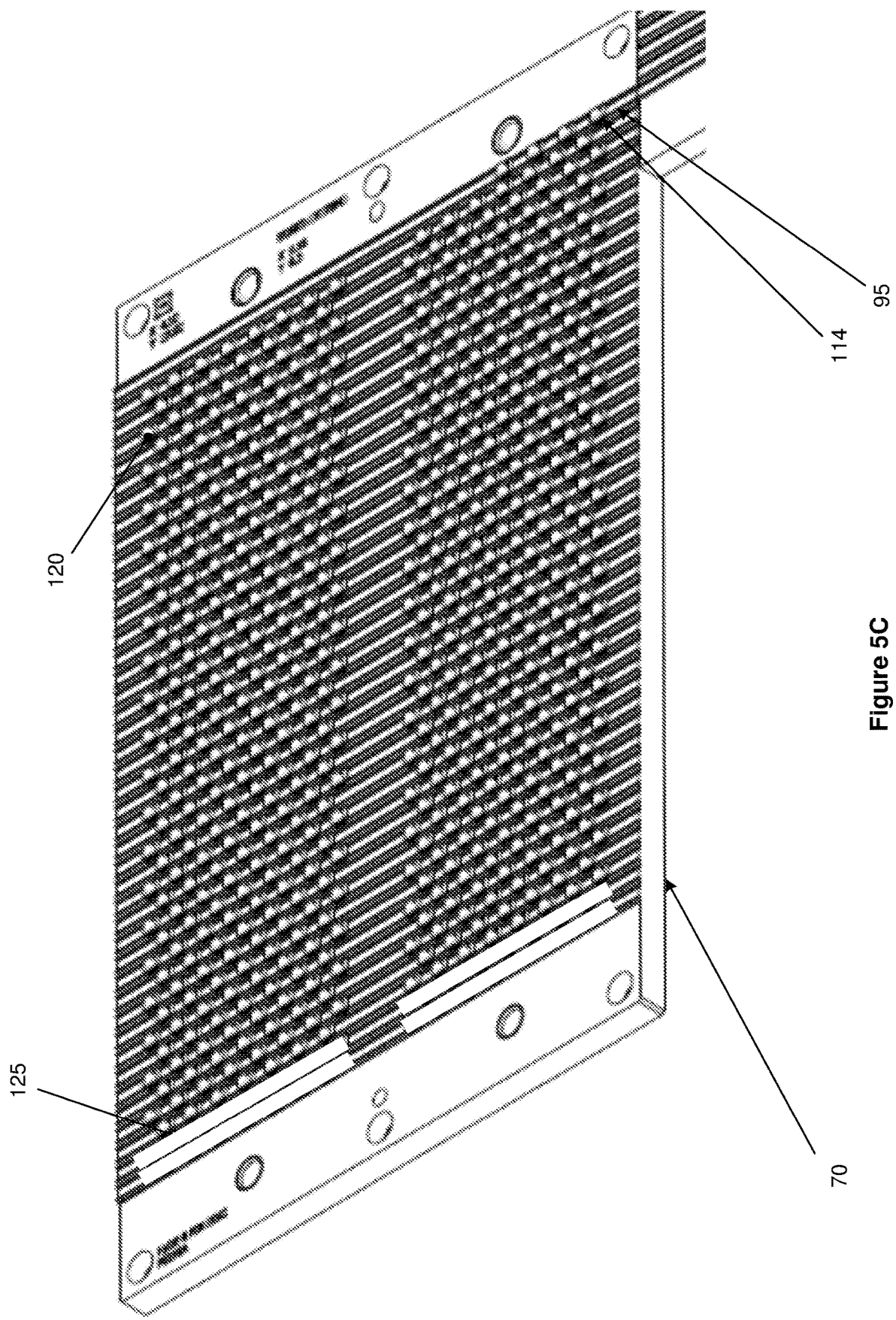

Unlike the prior art where the net table receives a dense array of units, in this embodiment the unit lifter 17 picks up all the units, and then places them in two batches on each side or zone 90A, 90B of the net table 70 as seen in FIGS. 5A to 5C. The arrangement of the units in each array is in the form of a checker board pattern so as to provide greater clearance about individual units as compared to the prior art having a dense array of units with the possibility of interference when engaging the unit pickers.

As part of an upstream process which may be achieved by a prior art system, each of the units having being inspected upstream have already been characterised as being accepted or rejected. Prior to delivering 19 the units to the net table 70, a control system will have already identified defective units which are to be rejected. The control system guides the unit pickers 40 to each of the rejected units to be removed. Thus, as shown in FIG. 5A, the net table 70 has the full load of units placed on the two halves 90A, 90B of the net table 70. FIG. 5B shows the result of the unit pickers having removed the rejected units from the net table 70 and therefore having gaps or voids 115 in the unit array. It will be appreciated that if the units are placed in the offloading system, irregular number of units will subsequently be loaded. Thus, as shown in FIG. 5C, the unit pickers 40 fill each of the voids 115 with peripherally deposited units such as those from the end rows 125, such that each of the rows 120 in the unit array is now filled. In a further embodiment, the units used to fill the gaps may be the most recently deposited on the net table. The gang pusher 45 then pushes each row of units into the offloading system via the delivery chute 20 and subsequently into the transition zone 75 to rearrange each row from a first pitch, corresponding to the spacing on the net table 70, to a second pitch for channels 80 leading to the offloading trays 30A to 30C.

As can be seen in FIG. 5A, the units 105 in the rows 110 of the delivery chute 100 correspond to a preceding batch of units. These units 105 include a final row 112 having an incomplete number of units, which prevents an appropriate number of units to be offloaded. In a still further embodiment, the pickers 40, when filling the gaps 115 on the net table 70, may further place units 114 in a buffer row 95. The control system, having calculated the remaining number of units following the rejected units being removed, will also calculate the final number of units in the final row 112 at the end of each batch. At the same time as filling the voids 115, the unit pickers also places extra units 114 corresponding to the shortfall of units in the last row 112. The gang pusher then pushes units from the buffer row 95 into the final row 112. With the extra units, the batch 105 of units in the delivery chute 100 now meets the required number for offloading with this batch 105 now proceeding to the next stage.

Figure 3:
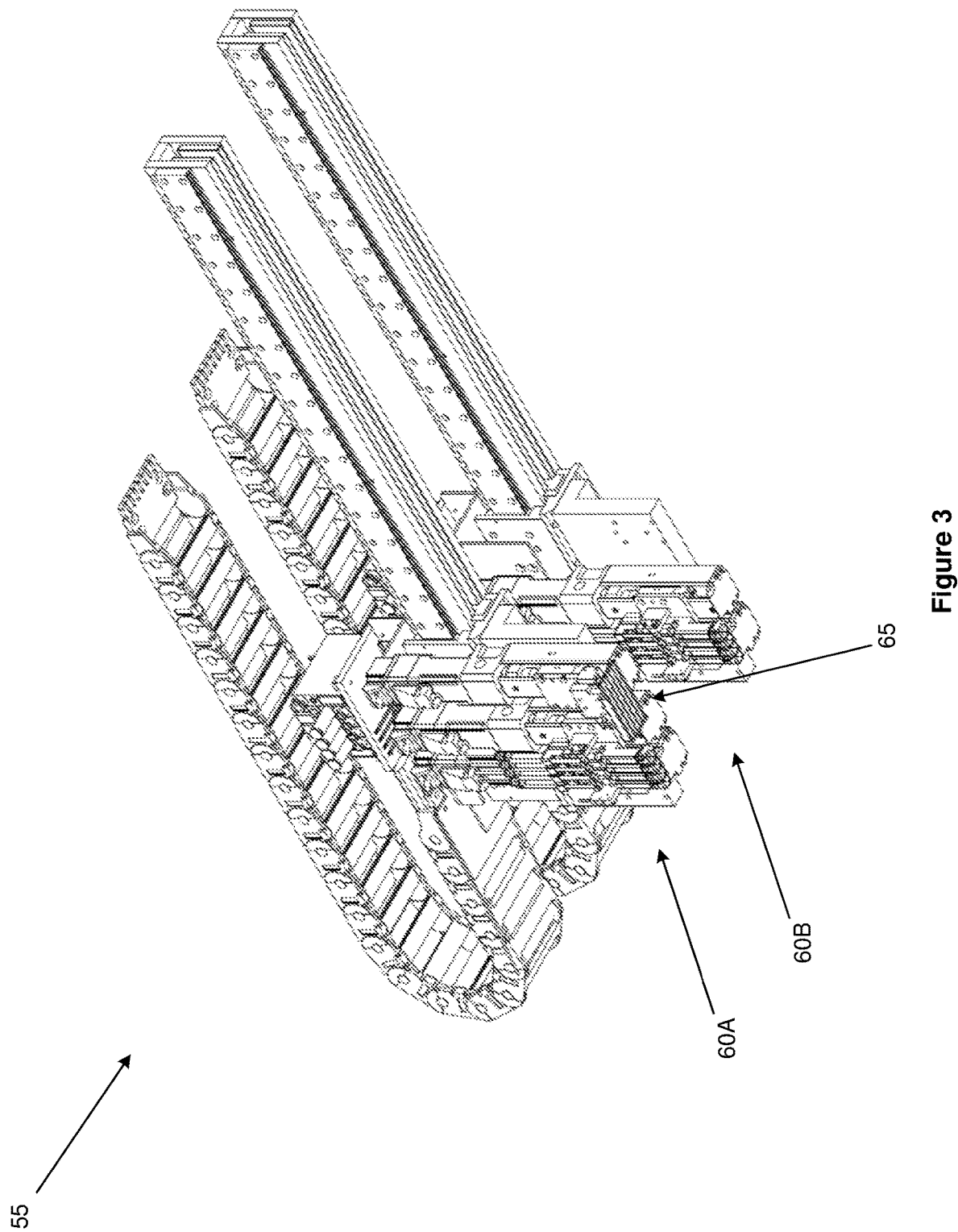
FIG. 3 is an isometric view of a dual pick & place and gang pusher arrangement according to a second embodiment of the present invention.
Figure 4:
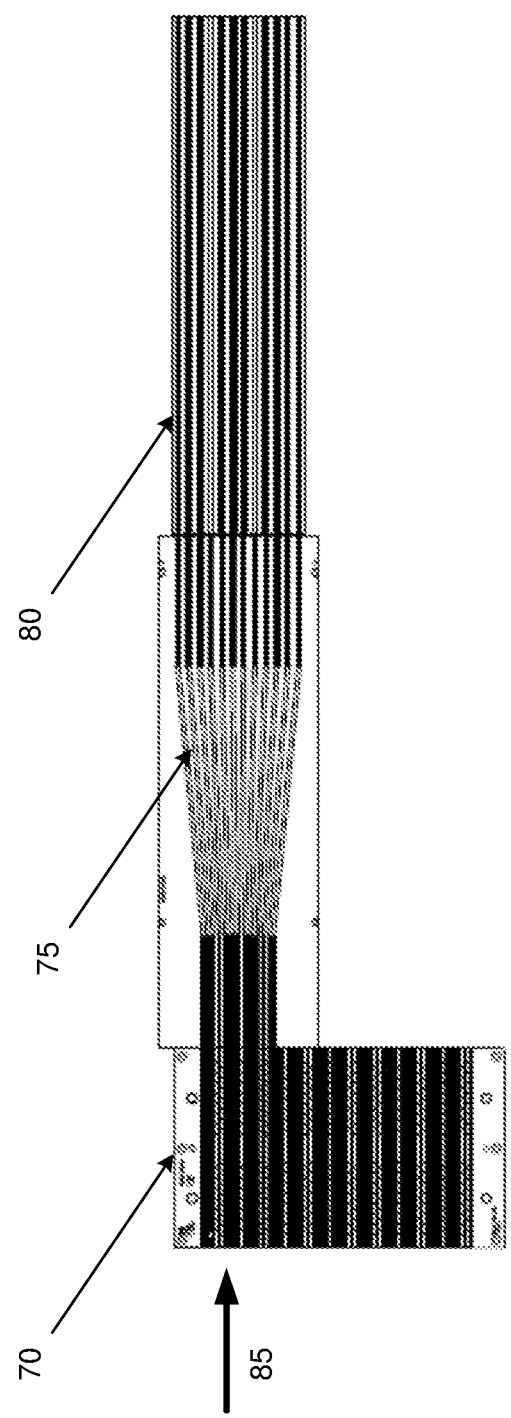
FIG. 4 is a plan view of a net table and offloading path according to one embodiment of the present invention.

Before proceeding to the next stage in the process, attention is drawn to FIG. 3 whereby a further embodiment of the picker system 55 includes dual unit pickers 60A, 60B, which is arranged to double the rate of sorting speed compared with a single system. Each bank of unit pickers 60A, 60B includes a gang pusher 65. For example, where a single system gang pusher may allow for pushing 6 rows, a dual system gang pusher 65 may allow for pushing 12 rows. The picker system may be triple or more, with the gang pusher arranged to push the requisite number of rows.

Figure 9A:
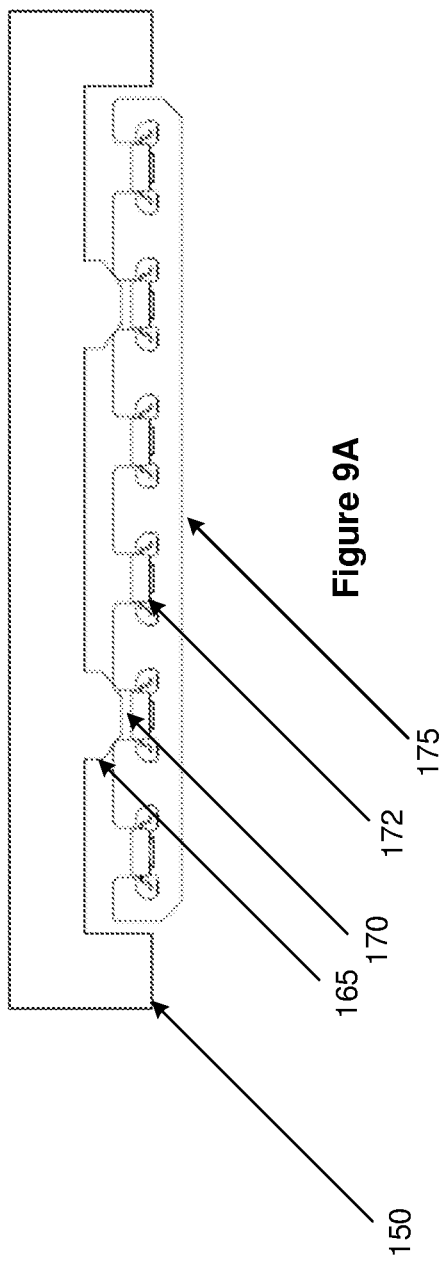
FIGS. 9A and 9B are elevation views of tray stoppers according to two embodiments of the present invention.
Figure 9B:
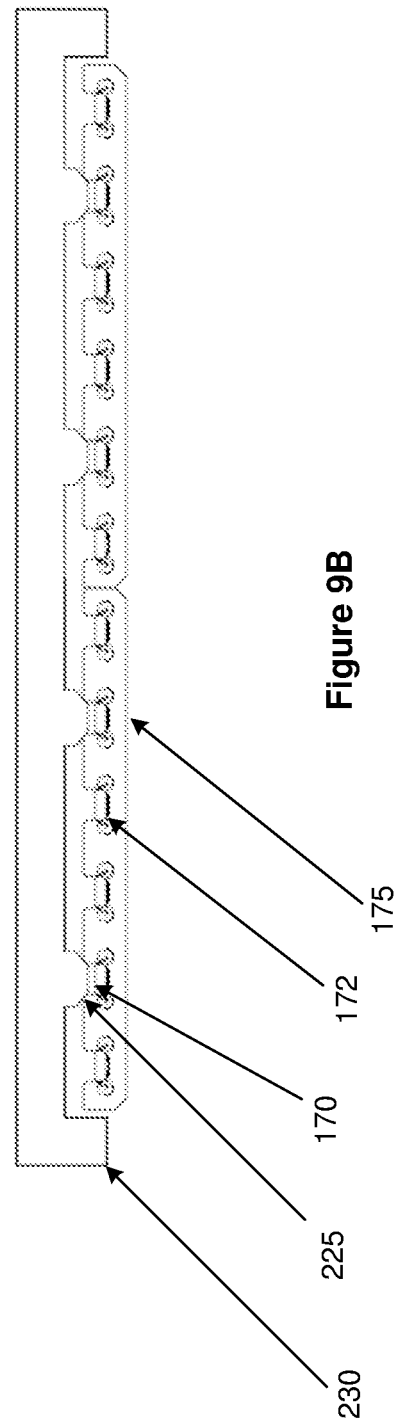

Thus, whilst previous embodiments have indicated a single delivery system, the embodiment of FIG. 3 further allows for a dual system to be used in conjunction with a second, or larger, net table and an increased number of channels in the delivery chute and subsequent offloading, which will be described with reference to FIG. 9B.

Whilst shown together with other aspects of the invention, the aforementioned aspects may be used in isolation from other aspects as part of other conventional systems. The aspects include:
i) The delivery of units by the unit lifter to form two, or more, batches on a net table;
ii) The removal of units by a unit picker, and subsequent refilling of voids with each batch;
iii) The use of a buffer lane for equalising the number of units to be delivered to the offloading area.

Figure 6A:
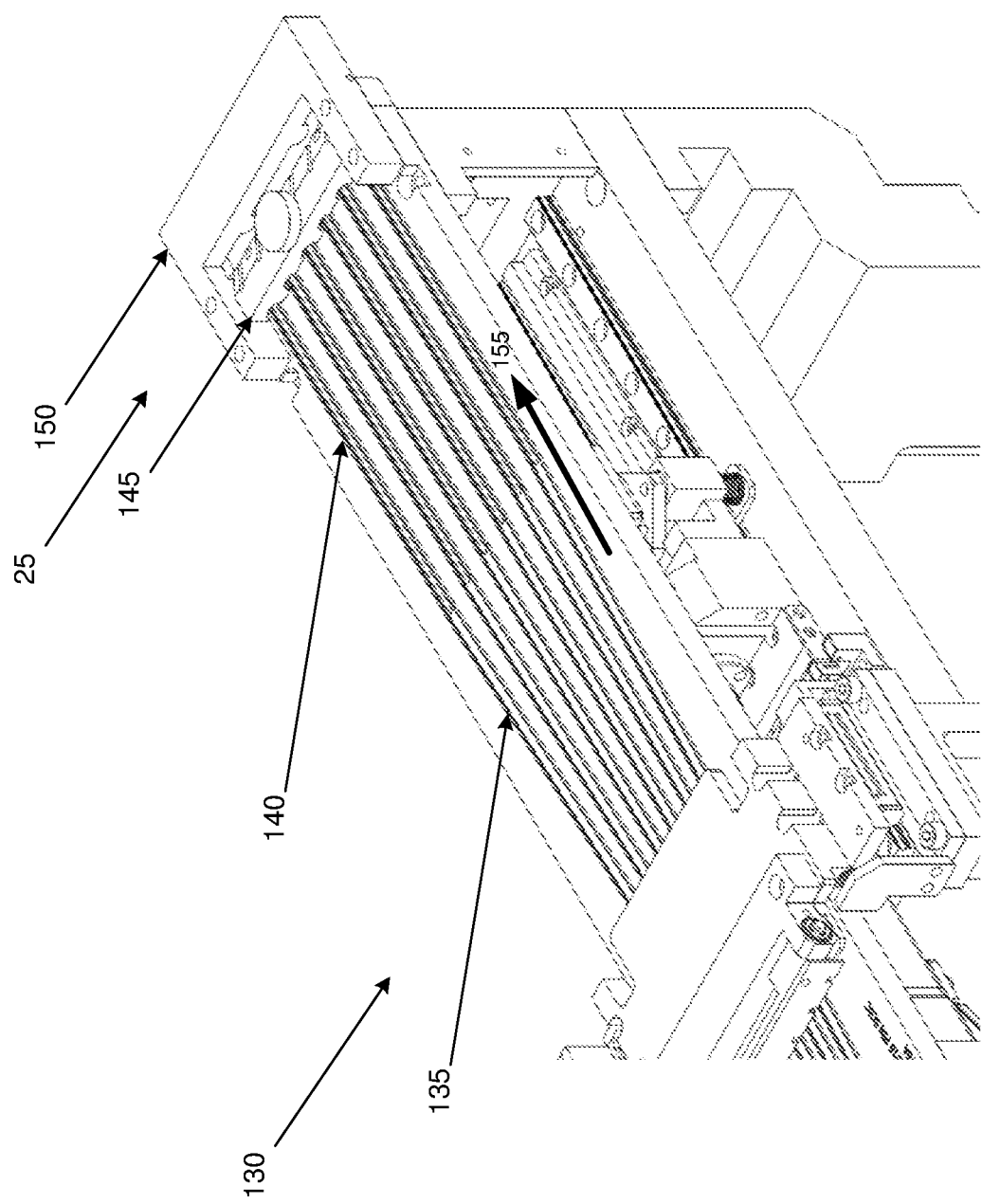
FIGS. 6A and 6B are isometric views of a sorting and offloading system according to a further embodiment of the present invention.
Figure 6B:
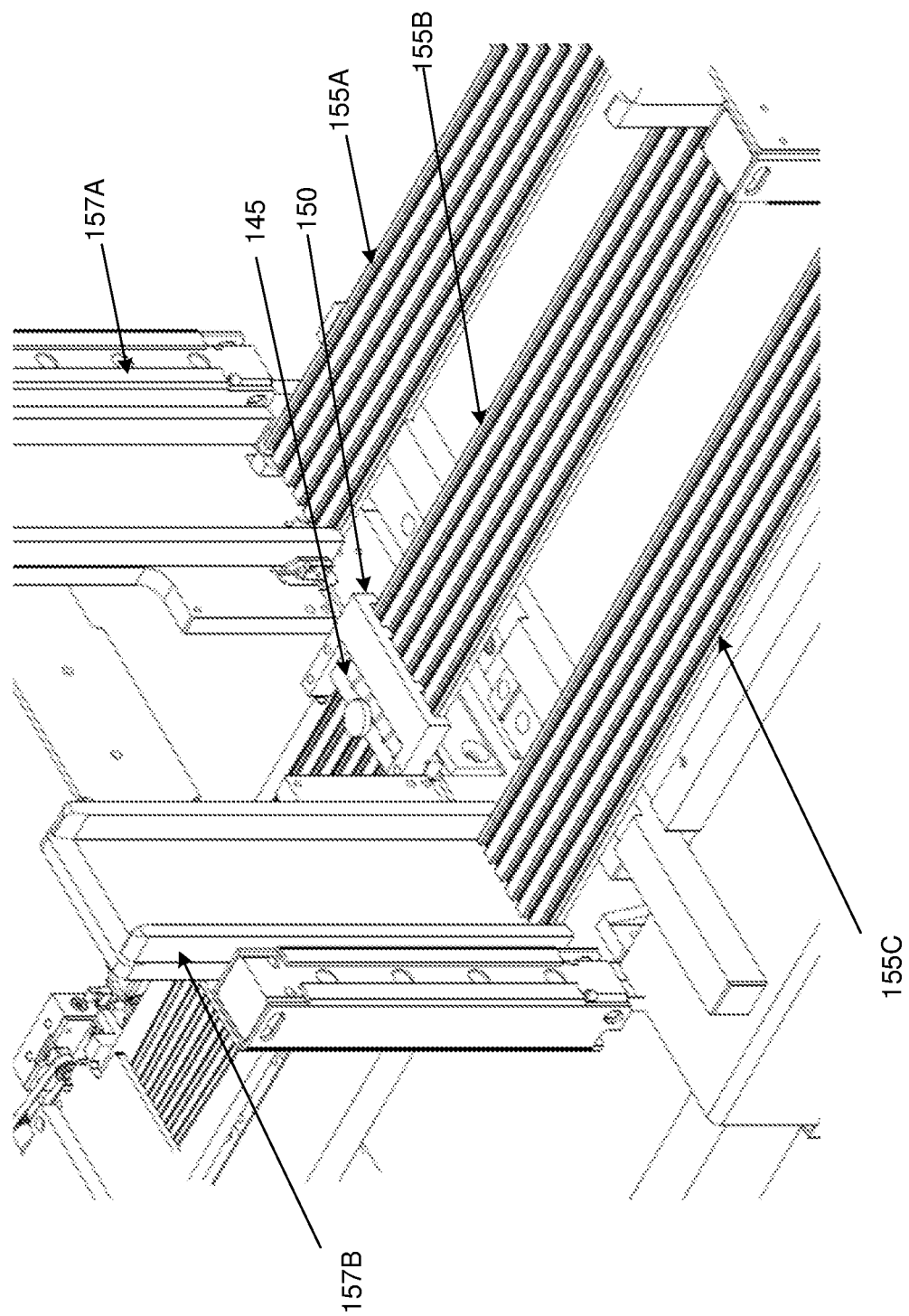

FIGS. 6A and 6B show the next stage in the process following placement of the units into the delivery chute. The units pass through a transition zone 135 with adjacent rows being widened from a first pitch, corresponding to the pitch of adjacent rows on said net table, to a second pitch corresponding to the offloading trays. Once in the rows 140 the units are directed 155 into a unit stopper assembly 25 having a top guide 145 and a tray stopper 150. The units then pass into the engaged offloading tray 155B which is received from adjacent registers 157A, 157B to provide a supply of unloaded trays 155A, 155C once the engaged tray 155B has been filled and offloaded.

Figure 8:
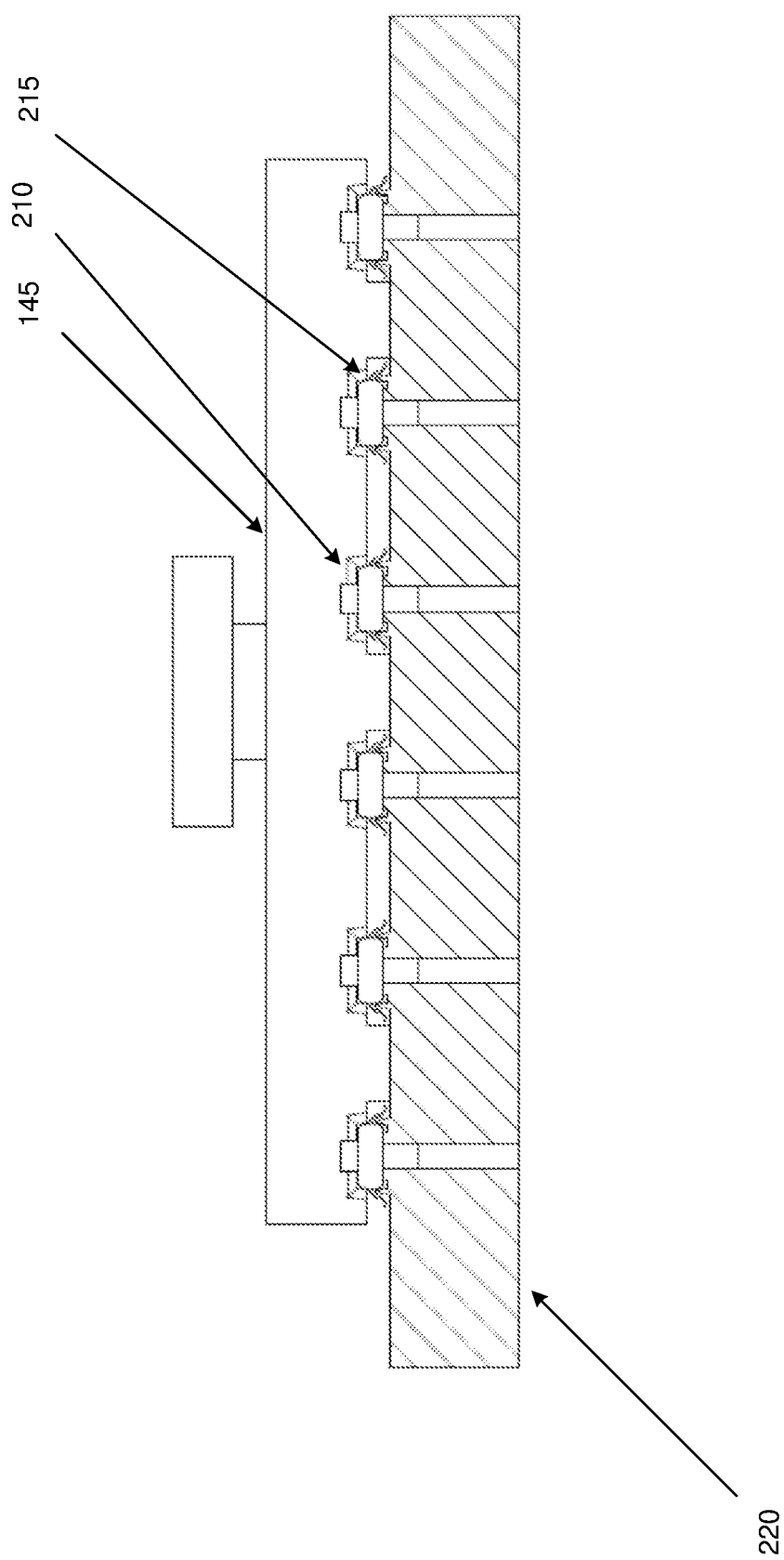
FIG. 8 is an elevation view of a top guide according to one embodiment of the present invention.

FIG. 8 shows an elevation view 145 which is arranged to provide a top guide having grooves 210 above slots in the channel through which the units are directed, so as to smooth out the line of units 215 as they pass through channels 220. By providing a guide with the grooves 210 any misalignment of the units which prevent the free flow of units into the trays is prevented. It will be appreciated that if a unit is misaligned whilst passing through channel 140, this may create a blockage that cannot be overcome by the pushing of the unit row. This blockage may then lead to a buckling of the units clogging the offloading system. By guiding the units through the channel 220 the top guide maintains the alignment of the units 215 and so ensures a steady flow of units.

Figure 7A:
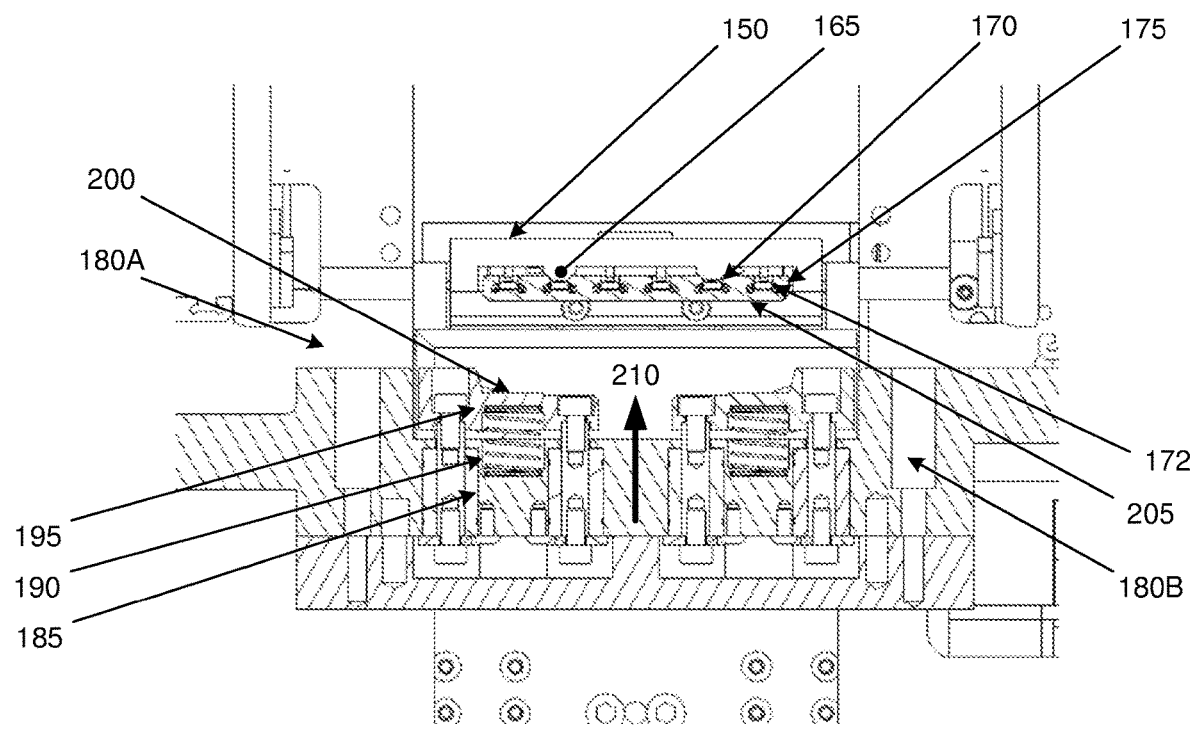
FIGS. 7A and 7B are elevation views of a tray lifter according to one embodiment of the present invention.
Figure 7B:
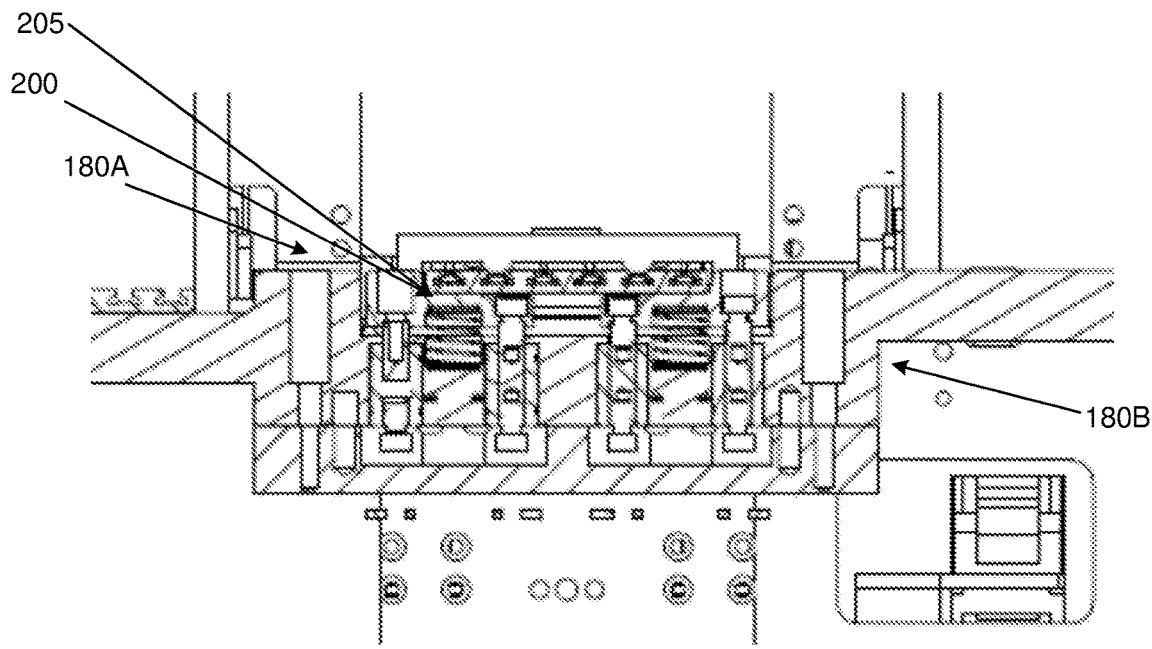

FIGS. 7A and 7B show a tray stopper 150 which is arranged to provide a reaction force against an applied resilient force from a pair of tray lifters 180A, 180B. Each tray lifter 180A, 180B includes an actuator to lift 210 a platform 195 so as to contact the platform 200 with an underside 205 of the tray 175. Each tray lifter 180A, 180B includes a spring 190 to ensure a resilient force is applied by the platform 200 to the underside of the tray 205. Above the tray the tray stopper includes projections 165 having a beveled shape which are arranged to fit within slots 170 of the tray 175. The projections 165, having the bevel, are arranged to contact the edge of the slots 170, but not engage the units 172 which are free to flow into the tray 175. With the tray stopper 150 forming a reaction force against the resilient lifting of the tray lifter, the tray is securely held to permit the units 172 to move unhindered into the tray 175. The resilient contact of the platform for the tray lifter further allows for any warping of the tray 175. By providing a resilient balancing force from underneath against the projection 165, any non-uniformity of the tray 175 is accommodated and so facilitates the movement of the units 172.

As mentioned with regard to FIG. 3, the present invention further extends to a dual flow of units by having a further embodiment of the tray stopper 230. In this embodiment the trays 175 are identical to the single tray stopper 150 of FIG. 9A, however the breadth of the tray stopper 230 allows for two trays to be held by the various projections 225. Thus, for the double flow of units from the net table accommodated by the various dual components, including that shown in FIG. 3, the embodiment of FIG. 9B facilitates the offloading at twice the rate of that shown of the system.

The invention claimed is:
1. A unit sorting system comprising:
a net table for receiving units and a unit lifter for depositing said units on the net table;
the net table having a first and second zone;

wherein the unit lifter is arranged to engage a batch of units and then deposit a first half of the batch to the first zone and deposit a second half of the batch to the second zone and each half batch of units is deposited in a checker board pattern in the respective zones; said checker board pattern configured to provide clearance about each of the units so as to avoid interference when a unit picker engages the units;

a unit picker assembly including said unit picker, wherein said unit picker is arranged to engage at least one of said units from the net table;

said net table including a buffer row;

a control system arranged to determine a number of shortfall units for an offloading row;

said unit picker arranged to engage the number of shortfall units from a periphery of the batch and place in the buffer row;

a gang pusher arranged to push the number of shortfall units in the buffer row into the offloading row.

2. The unit sorting system according to claim 1, wherein said control system is arranged to identify defective units and control the unit picker to engage and remove at least one defective unit from the batch.

3. The unit sorting system according to claim 2, wherein said unit picker is further arranged to engage a unit from the periphery of the batch and place it in a gap created by the removal of said rejected unit.

\* \* \* \* \*